United States Patent [19]
Nakasuji

[11] Patent Number: 5,952,133
[45] Date of Patent: Sep. 14, 1999

[54] METHODS FOR EVALUATING IMAGE-FORMING CHARACTERISTICS OF A PROJECTION-OPTICAL SYSTEM USED IN A CHARGED-PARTICLE-BEAM MICROLITHOGRAPHY APPARATUS

[75] Inventor: Mamoru Nakasuji, Yokohama, Japan

[73] Assignee: Nikon Corporation, Tokyo, Japan

[21] Appl. No.: 08/960,325

[22] Filed: Oct. 29, 1997

[30] Foreign Application Priority Data

Oct. 31, 1996 [JP] Japan ................................. 8-289787

[51] Int. Cl.[6] ...................................................... G03F 9/00
[52] U.S. Cl. ................................ 430/22; 430/30; 430/296
[58] Field of Search ............................... 430/22, 296, 30

[56] References Cited

U.S. PATENT DOCUMENTS 5,824,441  10/1998  Farrow et al. ............................ 430/296

Primary Examiner—Christopher G. Young
Attorney, Agent, or Firm—Klarquist Sparkman Campbell Leigh & Whinston, LLP

[57] ABSTRACT

Methods and devices are disclosed for evaluating image-forming characteristics of a projection system of a charged-particle-beam (CPB) microlithography apparatus. Signals providing information on such characteristics are obtained with a high S/N ratio and with high accuracy. Multiple markers are formed on an evaluation substrate mounted on a wafer stage. The projection system comparatively scans a projected image (using the CPB) of an evaluation pattern and a marker, while charged particles or secondary electrons reflected from the marker are detected. The evaluation substrate is preferably a thin film having a mean atomic number of 16 or less. Each marker is formed from a material having a mean atomic number of at least 47. A CPB-absorption body is situated beneath the evaluation substrate to absorb charged particles that penetrate the evaluation substrate.

19 Claims, 5 Drawing Sheets

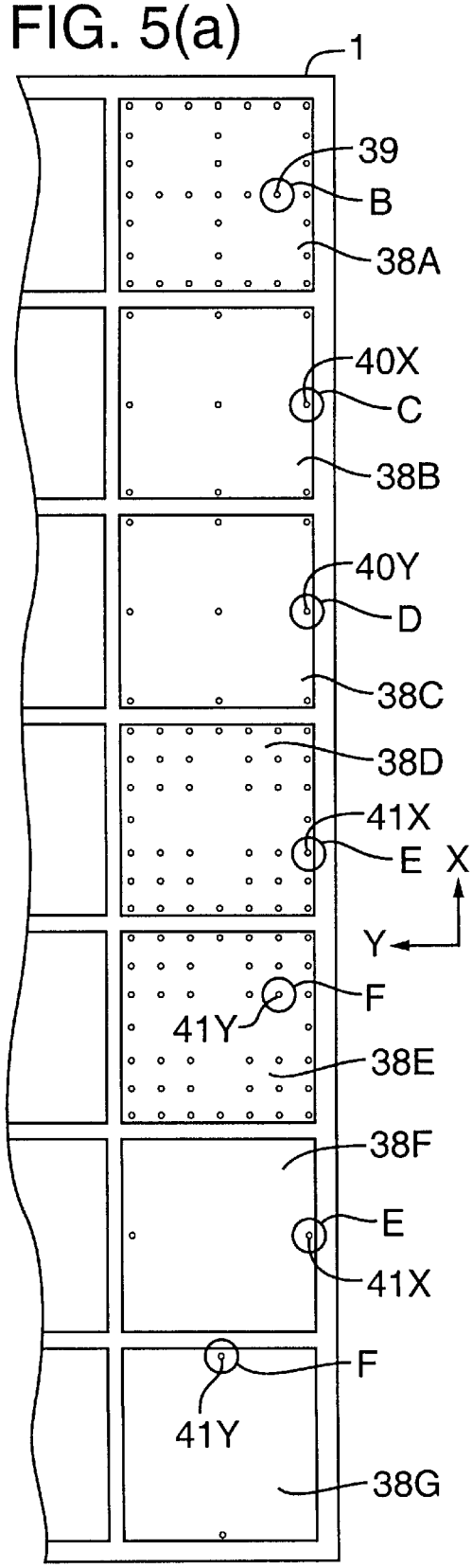
FIG. 5(a)
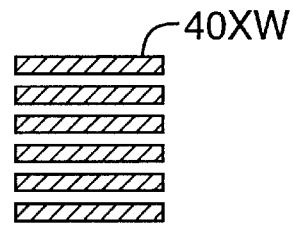
FIG. 5(b)
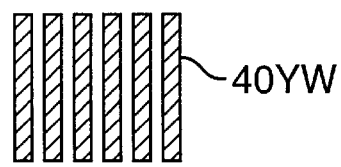
FIG. 5(c)
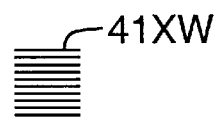
FIG. 5(d)
FIG. 5(e)
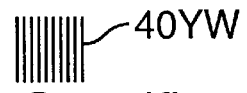
FIG. 5(f)

METHODS FOR EVALUATING IMAGE-FORMING CHARACTERISTICS OF A PROJECTION-OPTICAL SYSTEM USED IN A CHARGED-PARTICLE-BEAM MICROLITHOGRAPHY APPARATUS

FIELD OF THE INVENTION

The present invention pertains to methods for evaluating the image-forming characteristics of a microlithographic apparatus, particularly such apparatus comprising a projection-optical system for a charged particle beam used for "transferring" (projection-exposing) a mask pattern onto a surface of a sensitive substrate. Methods according to the invention are particularly suitable for evaluating resolution and astigmatic aberrations of a projection-optical system for use in electron-beam reductive-transfer apparatus as used in microlithography for manufacturing semiconductor integrated circuits and the like.

BACKGROUND OF THE INVENTION

In recent years, much research has been directed to the development of "reductive" projection-exposure apparatus employing a charged particle beam (CPB). By "reductive" is meant that the image formed on the sensitive substrate (e.g., semiconductor wafer) is smaller than the corresponding pattern defined by the mask, and "transfer" as used herein means the imprinting of a mask pattern on the surface of a sensitive substrate by irradiating a CPB through the mask pattern (or a portion thereof) and projecting a focused image of the mask pattern (or a portion thereof) onto the substrate surface for exposure. Image projection is erformed using a CPB "projection system" comprising lenses and other components capable of refracting, bending, and/or deflecting the CPB as required to form the projected image. Such research and development have been particularly directed to improving the resolution of the transferred pattern and improvements in throughput (productivity rate).

It is possible with a conventional CPB projection-exposure apparatus (as well as a conventional optical projection-exposure apparatus) to perform projection transfer in a "batch" manner. In "batch" transfer, the pattern of one complete "die" or sometimes of multiple dies is imprinted onto the substrate surface during a single exposure. A "die" corresponds to the pattern for one of a, typically, plurality of similar circuit patterns exposed onto the surface of a wafer, wherein each exposed die will ultimately become a separate device.

Unfortunately, it is extremely difficult to manufacture a mask suitable for batch transfer using a CPB transfer apparatus. In addition, it is difficult to adequately control aberrations of a CPB projection system having a field of view sufficiently large for transferring a complete die in a single exposure.

Thus, recent attention has been concentrated on developing CPB transfer apparatus that utilize a "divided" transfer system. In such a system, the mask pattern is divided into multiple "subfields" each representing a portion of the overall pattern to be transferred to each die. Typically, one exposure is required to transfer each subfield on the mask to a corresponding "transfer subfield" on the substrate. The subfields are normally exposed in an ordered sequential manner. Thus, transferring a single die requires multiple exposures. Divided transfer permits the imprinting of patterns that are simply too large to transfer, by CPB, as a single-die exposure.

With a divided transfer system, image-forming characteristics of the CPB projection system, such as distortion and astigmatism of the image projected onto the substrate surface, can be corrected in each subfield before the transfer operation. This allows each subfield exposure to be made with excellent resolution and positional accuracy on the overall die. However, in order to correct the image-forming characteristics in each subfield in this way, the CPB projection system must typically be accurately evaluated before exposure.

Under normal circumstances, it is possible to resolve, using a CPB, rectangular patterns of various sizes. CPB projection-transfer apparatus are known in which the transverse profile of the CPB can be varied ("variable-shape CPB"). This is typically accomplished by directing the CPB through a two-stage aperture and then through the CPB projection system. By making an appropriate adjustment of the transverse profile of the beam, projected images of variable size can be projected onto the sensitive substrate. Particularly with such apparatus, it is important that the image-forming characteristics of the CPB projection system be accurately evaluated to ensure that patterns are projected onto the substrate with high precision.

Conventionally, image-forming characteristics of an electron-beam projection-optical system are measured by projecting an image of an evaluation pattern onto a marker using the CPB projection system. Electrons reflected from the marker are detected. The marker and the evaluation-pattern image are comparatively scanned. Certain characteristics of the CPB projection system are determined from dimensional intensity variations of the reflected electrons. The marker typically comprises a pattern having features defined by a deposit of fine particles made from a material having a high atomic number (such as gold). The particles are adhered to a substrate made from a material having a low atomic number.

Unfortunately, the reflected-electron signals from the fine particles are weak. Also, electrons are also usually reflected from the substrate; the resulting background "noise" is quite strong, which results in a low signal-to-noise (S/N) ratio of the detection signal. The low S/N ratio, in turn, makes it difficult to evaluate the image-forming characteristics of the CPB projection system with sufficiently high accuracy.

When it is necessary to evaluate a CPB projection system for use in a divided-transfer CPB microlithography apparatus, the background noise normally is too high to provide an adequate S/N ratio of the detection signal.

SUMMARY OF THE INVENTION

In view of the foregoing, an object of the present invention is to provide methods for evaluating an image-forming characteristic of a CPB projection system and provide a detection signal having a sufficiently high S/N ratio for the method to provide high-accuracy evaluation data.

According to a first aspect of the invention, a device is provided for evaluating an image-forming characteristic of a charged-particle-beam (CPB) projection system of a CPB microlithography apparatus. The apparatus comprises an illumination system for directing a charged particle beam onto a region of a first surface defining a pattern to be projected onto a second surface. The apparatus also comprises first and second stages. The first stage is used for holding the first surface at a first-surface level as required during illumination of the first surface by the charged particle beam. The second stage is used for holding the second surface at a second-surface level during exposure of the second surface. The apparatus also comprises a CPB projection system for projecting a portion of the charged particle beam passing through the first surface onto a region of the second surface so as to expose the second surface. The device for evaluating the image-forming characteristic comprises an evaluation pattern mountable on the first stage. The evaluation pattern comprises at least one pattern feature that can be projected as an image by the charged particle beam passing through the evaluation pattern. The device also comprises an evaluation substrate mountable on the second stage. The evaluation substrate comprises at least one marker having a profile corresponding to the feature of the evaluation pattern. The evaluation substrate is preferably made of a material having a thickness of no more than 2 $\mu$m and a mean atomic number of no more than 16. The marker is preferably made of a material having a thickness of at least 0.01 $\mu$m and a mean atomic number of at least 47. The evaluation pattern and the evaluation substrate are movable relative to each other by actuating the first and second stages, respectively, such that the marker and the feature of the evaluation pattern can be comparatively scanned relative to each other. A detector is provided that detects charged particles released from the marker during comparative scanning of the marker and feature relative to each other and for producing an electrical signal encoding data, obtained during the comparative scanning, concerning an image-forming characteristic of the CPB projection system. The detector is connected to a processor that determines from the data a measurement of the image-forming characteristic. I.e., the image-forming characteristic is evaluated based on the intensity of reflected charged particles and/or secondary electrons generated from the marker when the image of the feature of the evaluation pattern and the marker are comparatively scanned by the charged particle beam passing through the CPB projection system.

The apparatus also preferably comprises a charged-particle-absorption body attached to the evaluation substrate. The charged-particle-absorption body is operable to absorb charged particles in the CPB passing through the evaluation substrate so as to measure a beam current of charged particles.

An amplifier is preferably connected to the charged-particle-absorption body to measure absorbed charged particles.

The charged-particle-absorption body preferably comprises a cylindrical portion and a terminal conical portion. The terminal conical portion is especially effective in preventing secondary electrons and other charged particles from passing back through the evaluation substrate. The charged-particle-absorption body is preferably made of an electrical conductor or semiconductor. Because almost no electrons and other charged particles return from the charged-particle-absorption body, background noise is further reduced and the signal-to-noise ratio of the detection signal is enhanced.

The charged-particle-absorption body is preferably made of a material that is a conductor or a semiconductor having a mean atomic number of 13 or less. E.g., aluminum (atomic number 13) or carbon (atomic number 6) can be used. Using such materials ensures that the number of reflected charged particles from the material are sufficiently reduced keep background noise low.

The apparatus preferably further comprises a deflector connected to the central processor. The deflector receives impulses from the central processor sufficient to cause the deflector to correct an error in the image-forming characteristic of the CPB projection system during exposure.

Further with respect to a preferred embodiment, the first and second stages are connected to the central processor so as to receive impulses from the central processor to cause the first and second stages to move sufficiently to correct an error in the image-forming characteristic of the CPB projection system during exposure.

The evaluation substrate preferably comprises multiple marker regions, wherein at least some of the marker regions define a respective marker. In such an embodiment, the evaluation pattern comprises multiple subfields each comprising at least one feature corresponding to a respective marker. The multiple features and respective markers allow the apparatus to determine a plurality of image-forming characteristics of the CPB projection system. The image-forming characteristics that can be measured using such features and markers include the intensity distribution of the CPB over a subfield area exposed by the CPB projection system, resolution, astigmatism, distortion, and magnification errors of the CPB projection system.

By way of example, the charged particle beam can be an electron beam. In such an instance, an evaluation substrate having a mean atomic number of 16 or less and a thickness of 2 $\mu$m or less will allow a large number of electrons accelerated to approximately 100 kV to pass through the evaluation substrate; thus, the number of reflected electrons will be insignificant. Also, a marker having a mean atomic number of 47 or more and a thickness of 0.01 $\mu$m (10 nm) or more will produce a large number of reflected electrons and/or secondary electrons especially when the marker comprises fine particles of, e.g., gold with a size of approximately 10 nm. Thus, the signal-to-noise (S/N) ratio of the signal produced by the reflected-electron detector is improved, allowing the image-forming characteristic of the CPB projection system to be evaluated with high accuracy.

By having the marker have a surface area of $(0.2 \mu m)^2$ or more and by having the projected feature have a surface area essentially equal to the area of the respective marker, the charged-particle intensity within the subfield area exposed by the CPB projection system can be determined from the reflected charged particles and/or secondary electrons detected whenever a comparative scan is performed of the marker relative to the projected image of the feature. This is because, inter alia, the marker is sufficiently large to produce a large number of reflected charged particles. Also, by having the projected image of the feature have a size approximately equal to the size of the marker, a measurement conducted at one measurement point (i.e., at one projected feature within the evaluation pattern) is less affected by reflected charged particles from other measurement points, thereby reducing background noise. The resulting high S/N ratio makes it possible to evaluate the intensity distribution within the subfield area, exposed by the CPB projection system, with an accuracy of more than 1 percent.

According to another aspect of the invention, methods are provided for evaluating an image-forming characteristic of a CPB projection system that projects onto a second surface an image of a pattern defined on a first surface. In a first step of the method, an evaluation pattern is provided on a first surface; the evaluation pattern defines at least one feature. In a second step, a film is provided on a second surface; the film preferably has a thickness of 2 $\mu$m or less, preferably comprises a material with a mean atomic number of no greater than 16, and comprises at least one marker having a shape corresponding to the feature on the evaluation pattern. The marker preferably comprises a material having a thickness of at least 0.01 $\mu$m and a mean atomic number of at least 47. In a third step, the evaluation pattern is irradiated with a CPB (e.g., an electron beam) so as to form an image of the feature of the evaluation pattern on the respective marker.

During such irradiation, the CPB is directed to pass through the pattern, through the CPB projection system, and onto the respective marker. In a fourth step, an image of the evaluation pattern formed by the CPB projection system on the marker is comparatively scanned. The intensity of reflected charged particles or secondary electrons generated from the marker during the scanning is measured to obtain signals including data on the image-forming characteristic.

The evaluation pattern preferably comprises multiple subfields each comprising multiple features in an array in each subfield. The film preferably comprises multiple marker regions; at least some of the marker regions comprise a respective marker, and each marker corresponds to a respective feature in at least one subfield. Each marker preferably has a surface area of at least $(0.2\ \mu m)^2$.

Each feature on a subfield of the evaluation pattern, when the feature is projected onto the film by the CPB projection system, preferably has an area essentially equal to an area of the respective marker on the film. For example, for measuring an intensity distribution of the CPB across its subfield area as projected by the CPB projection system, it is preferable that at least one subfield comprise a single isolated square feature. In such an instance, the marker region corresponding to the subfield having the single isolated square feature preferably comprises an array of square markers so that measurements can be obtained across the subfield area.

As another example, at least one subfield can comprise a feature configured as a parallel periodic array of elements. In such an instance, the marker region corresponding to the subfield having the parallel periodic of elements preferably comprises an array of markers each comprising a parallel periodic array of elements each having a size, shape, and spacing corresponding to the size, shape, and spacing of the elements of the respective feature when projected on the marker region by the CPB projection system. Such a configuration, when comparatively scanned, provides data concerning an imaging characteristic selected from a group consisting of resolution, astigmatism, distortion, and magnification errors of the charged particle beam across its subfield area as projected by the CPB projection system.

Each of the periodic features can be lines. For example, each of the lines can have a width from 4× to 8× the resolution of the CPB, and a length of 10 $\mu$m or more. Such lines can be arranged in groups of five to 100 lines per feature at a pitch of 8× to 16× the resolution of the CPB. Such a configuration is especially suitable for obtaining data concerning resolution or astigmatism of the CPB projection system (scanning is performed in a pitch direction of the lines). As a further example, if the lines each have a width that is 2× the beam resolution, the resulting detection signal typically has flat bottom and top portions. If the flat portion is differentiated with respect to time, a beam intensity distribution can be obtained. From the leading edge of the differentiated signal, the beam resolution can be obtained. As a further example, when evaluation a CPB projection system having a beam resolution of 50 nm, the marker need have a pitch of only 0.8 $\mu$m. Because multiple lines are provided in a small area, the beam resolution can be measured with high accuracy.

By way of further example, each of the lines can have a width from 1× to 2× the resolution of the CPB, and a length of 5 $\mu$m or less. Such lines can be arranged in groups of five to twenty-five lines per feature at a pitch of 2× to 4× the resolution of the CPB. Such a configuration is especially suitable for obtaining data concerning distortion or magnification errors of the CPB projection system (again, scanning is performed in a pitch direction of the lines).

A height profile across the subfield area exposed by the CPB projection system (the height profile comprising multiple measurements of the best-focus position across the subfield area) where the beam resolution is at a maximum can be determined using patterns having feature elements (i.e., pitch) extending in two directions (preferably orthogonally with respect to each other). Such configurations are especially suitable for measuring astigmatism of the CPB projection system.position in two directions.

In order to measure distortion across the subfield area with high accuracy, each position of a projected image of a feature (that is as small as possible) must be measured at each measurement point within the subfield area. Because the mean positions of the markers and the entire surface area within each projected image are measured during comparative scanning of each of the features relative to the respective marker, it is preferable that the surface area of the markers be small, but not so small that the S/N ratio is adversely affected. For example, if the CPB resolution is 50 nm, the preferred maximum surface area of the marker is $(25\ \mu m)^2$.

In order to measure magnification error with high accuracy, one can compare an actual measurement, across an interval between two measurement points that are greatly separated within the subfield area, to a specified design value. For example, if the beam resolution is 50 nm, and the subfield area exposed by the CPB projection system has an angle of 250 $\mu$m, then the maximum width of the marker is 5 $\mu$m. In such an instance, the maximum interval between the two measurement points can be approximately 240 $\mu$m:

$D1=250-(2)(5)=240\ \mu m$.

If a positional detection of the projected image of the evaluation pattern is possible at an accuracy of approximately 1/10 (5 nm) of the beam resolution, then the accuracy by which magnification error can be measured can be approximately 0.002 percent (100×5 nm/240 $\mu$m).

The foregoing and additional features and advantages of the present invention will be more readily apparent from the following detailed description, which proceeds with reference to the accompanying drawings.

BRIEF DESCRIPTION OF THE DRAWINGS

FIG. 5(a) is an enlarged plan view of a portion of the mask detailing representative shapes of evaluation patterns on the mask.

FIG. 5(b) is an enlarged plan view of feature B shown in FIG. 5(a), as projected.

FIG. 5(c) is an enlarged plan view of feature C shown in FIG. 5(a), as projected.

FIG. 5(d) is an enlarged plan view of feature D shown in FIG. 5(a), as projected.

FIG. 5(e) is an enlarged plan view of feature E shown in FIG. 5(a), as projected.

FIG. 5(f) is an enlarged plan view of feature F shown in FIG. 5(a), as projected.

DETAILED DESCRIPTION

The embodiment described below, by way of example, is especially adapted for evaluating an image-forming characteristic of a CPB projection system as used in an electron-beam reductive transfer apparatus using a divided transfer system.

Figure 1:
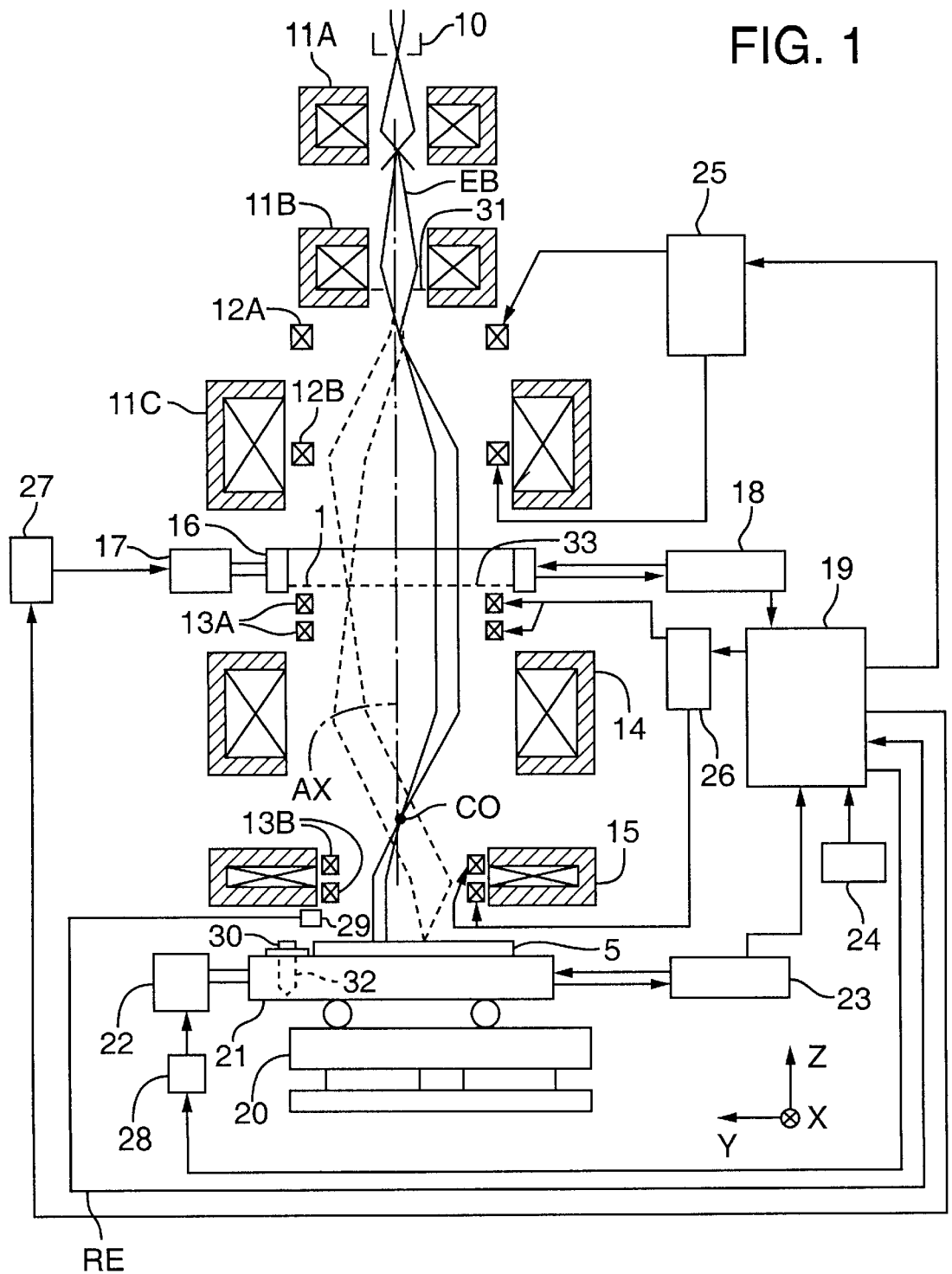
FIG. 1 is a schematic elevational, and partially sectional, view of an example embodiment of an electron-beam reductive transfer apparatus according to the present invention.

A schematic diagram of the overall system is shown in FIG. 1, in which the Z-axis is parallel to the optical axis AX of the electron projection system, the X-axis is perpendicular to the plane of the page, and the Y-axis is parallel to the plane of the page within a plane perpendicular to the Z-axis. The apparatus utilizes a mask 1 (divided into subfields that are not shown in FIG. 1) to provide a pattern to be transferred to a substrate 5 (e.g., semiconductor wafer coated with a substance that is sensitive to electrons). An image of each mask subfield is transferred to a corresponding "transfer subfield" (not shown in FIG. 1) on the substrate 5. The apparatus comprises, as arranged on the optical axis AX, an electron gun 10; first, second, and third condenser lenses 11A, 11B, 11C; subfield-selection deflectors 12A, 12B; deflectors 13A, 13B; a projection lens 14; an objective lens 15; a mask stage 16; a central processor 19; a wafer stage 21; a reflected-electron detector 29; an evaluation substrate 30; an aperture plate 31 situated close to the second condenser lens 11B and defining an axially-disposed aperture; and an electron-absorption body 32.

The electron gun 10 produces an electron beam EB that is converged by the first condenser lens 11A. The electron beam is converged again by the second condenser lens 11B and passes through the aperture defined by the aperture plate 31. After passing through the aperture, the electron beam EB is deflected mainly in a first Y-direction by the first subfield-selection deflector 12A, and made into a parallel beam by the third condenser lens 1C. The electron beam is then deflected in a second Y-direction (opposite the first Y-direction) by the second subfield-selection deflector 12B and directed to an irradiation region 33 in a subfield of the mask 1. The amount of deflection imparted by the subfield-selection deflectors 12A, 12B is set by a deflection controller 25 connected to the central processor 19 that provides overall operational control of the entire apparatus.

As can be seen in FIG. 1, the solid lines representing the electron beam EB indicate a conjugate relationship of a crossover image; the broken lines representing the electron beam EB indicate a conjugate relationship of the mask pattern. The surface of the aperture plate 31 is situated conjugate to the surface of the mask 1; the projected image of the aperture defined by the aperture plate 31 is the irradiation region 33 at which the electron beam impinges on the mask 1.

Electrons in the beam EB passing through a subfield on the mask 1 are deflected by the deflector 13A (preferably comprising a two-stage electromagnetic deflector). The electrons are formed into a crossover CO by the projection lens 14. The electrons then converge on a corresponding transfer subfield on the wafer 5 (coated with an electron-beam resist) by passage through the objective lens 15 and deflector 13B (preferably comprising a two-stage electromagnetic deflector) The image of the mask subfield formed on the respective transfer subfield of the wafer 5 is reduced in size relative to the mask subfield by a fixed magnification factor β(e.g., β=¼).

By way of example, the projection lens 14 and the objective lens 15 comprise a "CPB projection system" utilizing a symmetric magnetic doublet (SMD) system.

The present invention is directed, inter alia, to methods for evaluating the image-forming characteristics of the CPB projection system. The amount of deflection imparted by the deflectors 13A, 13B to the CPB is set by a deflection controller 26 connected to the central processor 19.

In the divided transfer system, each mask subfield is situated between struts (support members) arranged between each adjacent subfield. The struts are situated beneath corresponding boundary regions on the mask. The transfer subfields on the wafer 5 lack boundary regions; the transfer subfields are "stitched" together on the wafer 5. In order not to include the boundary regions on the pattern image formed on the wafer 5, the deflectors 13A, 13B cause the electron beam to shift a lateral distance corresponding to the width of a boundary region, sufficient to eliminate boundary regions in the projected image. Thus, the deflectors 13A, 13B are used to correct errors of pattern registration between the mask 1 and the wafer 5.

The mask 1 is mounted to the mask stage 16 parallel to the XY plane. During projection exposure, a mask-stage actuator 17 moves the mask stage 16 continuously in the X-direction and step-wise in the Y-direction. Positions of the mask stage 16 within the XY plane are detected by a laser interferometer 18 that produces signals that are output to the central processor 19.

The wafer 5 is held on a wafer stage 21 on a specimen table 20 parallel to the XY plane. The specimen table 20 adjusts the position of the wafer stage 21 (with wafer 5) in the Z-direction. During projection exposure, a wafer-stage actuator 22 moves the wafer stage 21 continuously in the X-direction but in a direction opposite to the direction of continuous movement of the mask stage 16. The wafer-stage actuator 22 also moves the wafer stage 21 stepwise in the Y-direction (but in a direction opposite to the stepwise movement direction of the mask stage). The movement directions of the wafer stage 21 are opposite the corresponding directions of movement of the mask stage 16 due to the reversal of the mask-pattern image by the CPB projection system. If necessary, the wafer stage 21 can be moved continuously both in the X- and Y-directions. Positions of the wafer stage 21 within the XY plane are detected by a laser interferometer 23 that outputs signals to the central processor 19.

During projection-exposure of the mask pattern, the central processor 19 calculates the amount of deflection that needs to be imparted to the electron beam EB by the subfield-selection deflectors 12A, 12B and by the deflectors 13A, 13B. These calculations are based on exposure data that can be input by an operator using a data-input device 24 (such as a keyboard) or obtained from a memory or other data storage medium. Positional data concerning the mask stage 16 and the wafer stage 21 are obtained by the laser interferometers 18, 23. The central processor 19 performs calculations of parameters (e.g., position and movement speed) necessary to perform coordinated movement of the mask stage 16 and the wafer stage 21. Signals corresponding to the results of calculations regarding the magnitude of deflection are output from the central processor to the deflection controllers 25, 26 that energize the subfield-selection deflectors 12A, 12B, and the deflectors 13A, 13B sufficiently to perform the proper deflection of the electron beam EB. The central processor 19 also performs calculations necessary to control the magnitude of deflection imparted to the beam by the deflectors 13A, 13B, and to control the amount of electrical current delivered to the CPB projection system in response to prior measurements of the image-forming characteristics of the CPB projection system.

The results of calculations (performed by the central processor 19) pertaining to the movements of the mask stage 16 and the wafer stage 21 are output to respective drivers 27, 28. The drivers 27, 28 control operation of respective actuators 17, 22 so as to move the respective stages 16, 21 in accordance with the calculation results.

The data-input device 24 can be a device that receives data and operational commands directly from an operator via a keyboard or the like. Alternatively or in addition, the data-input device 24 can be operable to read recorded data on any of various media. The projection-exposure apparatus according to this embodiment also comprises a mechanism for evaluating one or more image-forming characteristics of the CPB projection system. To such end, an evaluation substrate 30 (preferably comprising monocrystalline silicon, $SiO_2$, $Si_3N_4$, SiC, or C) is mounted close to the wafer 5 on the wafer stage 21. An electron-absorption body 32 (most preferably comprising aluminum) is embedded beneath the evaluation substrate 30 to absorb electrons transmitted by the evaluation substrate 30.

Figure 2:
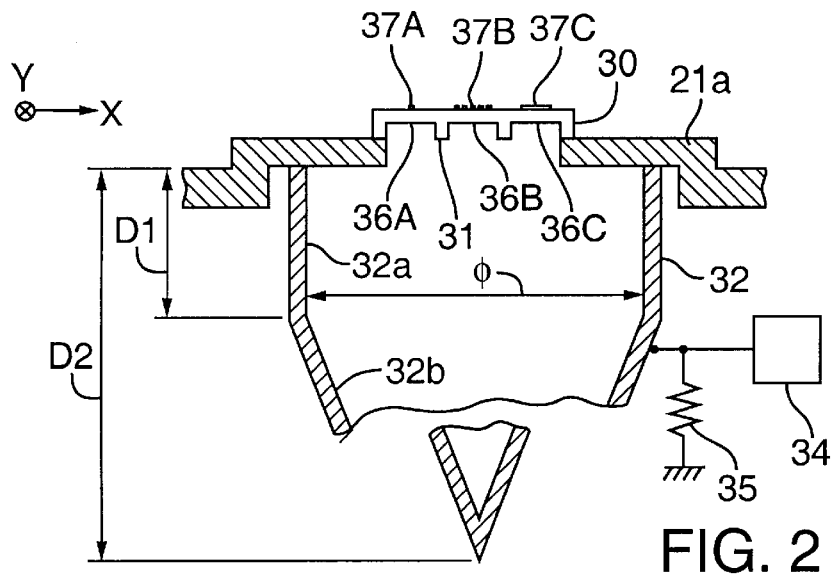
FIG. 2 is an enlarged sectional view of a portion of the evaluation substrate and the electron-absorption body in the FIG. 1 embodiment.
Figure 3:
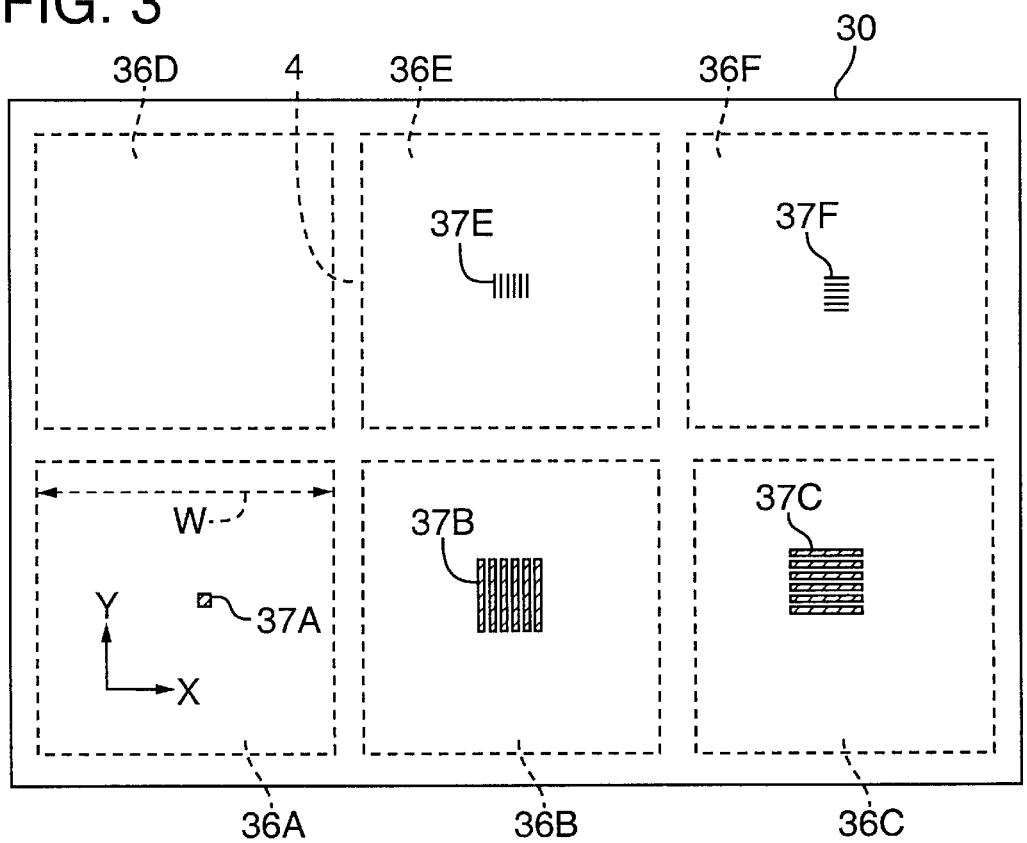
FIG. 3 is an enlarged plan view of the evaluation substrate of FIG. 2, comprising multiple marker regions and respective markers.

FIG. 2 is an enlarged vertical section of the evaluation substrate 30 and the electron-absorption body 32. In FIG. 2, the evaluation substrate 30 is mounted to an upper plate 21a of the wafer stage 21 and covering an opening defined by the upper plate 21a. Referring to FIG. 3, the evaluation substrate 30 preferably has a planar, rectangular shape, extending typically about 3 mm in the X-direction and about 2 mm in the Y-direction. The evaluation substrate 30 is divided by partitions 4 (typically about 100 $\mu$m thick and 100 $\mu$m wide) into multiple (preferably six) marker regions 36A to 36F. Each marker region 36A–36F is typically about 2 $\mu$m thick and about 1 mm square. The evaluation substrate 30 can be formed of monocrystalline silicon (about 100 $\mu$m thick). With such an evaluation substrate, the marker regions 36A–36F can be created by, e.g., etching to a thickness of 2 $\mu$m.

In general, the evaluation substrate 30 is preferably made from a material having an atomic number of 16 or less and exhibiting a low electron reflectivity. By way of example, materials other than silicon that can be used to form the evaluation substrate can be carbon or any of various synthetic composites of elements having a mean atomic number of 16 or less.

FIG. 3 shows a representative evaluation substrate 30 comprising six marker regions 36A–36F each about 1 mm square. Each of the marker regions 36A–36F comprises a respective marker 37A–37F. In this embodiment, if the beam resolution of the CPB projection system is approximately 50 nm (=0.05 $\mu$m, representing a target resolution value), each marker 37A–37F has a size of about 0.2 $\mu$m square to 10 $\mu$m square. Thus, although the size of each marker is small, the marker size is not insignificant compared to the size of the corresponding marker region. (In FIG. 3, the markers appear larger than they actually are relative to the size of each marker region. The markers 37A–37F are preferably formed from a thin film of gold approximately 0.05 $\mu$m thick sufficient to reflect electrons. In general, the thickness of the markers is preferably in the range of 0.01 $\mu$m to about 1 $\mu$m.

The marker 37A is preferably approximately 0.2 $\mu$m square (but can be larger such as 10 $\mu$m square) and is used for evaluations of the electron-beam intensity distribution within the subfield area exposed by the projection system. The marker 37A is preferably located at the center of the first marker region 36A.

The marker 37B is used for evaluating resolution and astigmatism of the image along the X-axis, and the marker 37C is used for evaluating resolution and astigmatism of the image along the Y-axis. Each of the markers 37B, 37C is preferably located at the center of the respective marker region 36B, 36C. The marker 37C is similar to the marker 37B but rotated 90 degrees relative to the marker 37B. Each of the markers 372, 37C preferably comprises a pattern of from five to about 100 lines (most preferably seventeen, but only six are shown). Each line of the markers 37B, 37C most preferably has a width in the X-direction and Y-direction, respectively, of 0.3 $\mu$m (six times the beam resolution) and a length in the Y-direction and X-direction, respectively, of 10 $\mu$m. The line pattern of each of the markers 37B, 37C has a pitch that can be in a range of 8× to 16× the beam resolution, most preferably 0.6 $\mu$m (12× the beam resolution). The line pattern of each of the markers 37B, 37C can have a width of 4× to 8× the beam resolution and a length of 10 $\mu$m to tens of $\mu$m. The duty ratio of the pattern of each of the markers 37B, 37C is preferably about 1:1.

The fourth marker region 36D lacks a marker. The marker region 36D is used, for example, when measuring background noise generated by electrons reflected from a region having no marker.

The marker 37E is used for evaluating distortion and/or magnification errors in the X-direction, and the marker 37F is used for evaluating distortion and/or magnification errors in the Y-direction. Each of the markers 37E, 37F is located at the center of the respective marker region 36E, 36F. The marker 37F is similar to the marker 37E but is rotated 90 degrees relative to the marker 37E. Each of the markers 37E, 37F is a pattern of parallel lines (preferably five to twenty-five lines, but only six are shown), the pattern preferably having a width from 1× to 2× the beam resolution (most preferably 0.1 $\mu$m which is about two times the beam resolution) and a length of about 2 $\mu$m to 5 $\mu$m (most preferably 5 $\mu$m). The pitch of the lines in each pattern is preferably 2× to 4× the beam resolution. For example, the marker 37E most preferably comprises twenty-five parallel lines at a pitch of 0.2 $\mu$m in the X-direction (4× the beam resolution) and a duty ratio of 1:1. The marker 37F is used to perform similar measurements, but in the Y-direction rather than in the X-direction.

A suitable material for making the markers 37A–37F has a mean atomic number of no less than 47 and reflects many electrons from an impinging beam. Materials other than gold (e.g., tungsten or silver) can be used.

Referring further to FIG. 2, the electron-absorption body 32 is mounted to the bottom surface of the upper plate 21a to completely cover the bottom portion of the evaluation substrate 30. The electron-absorption body 32 is preferably cylindrical over a portion D1 of its length with an inside diameter $\phi$ and an inner surface 32a. The terminus (that together with the cylindrical portion has a length D2) is preferably conical with an inside surface 32b. The electron-absorption body 32 is attached to the upper plate 21a. The inner surfaces 32a, 32b conform to the respective outer surfaces. Thus, the inner surface 32a is cylindrical and the inner surface 32b is conical with respect to the evaluation substrate 30. Preferably, φ<<D2. E.g., the inside diameter φ is most preferably 5 mm, the length D2 is most preferably 10 mm, and the length D1 is most preferably 2 mm.

The electron-absorption body 32 is connected to an amplifier 34 and one end of a resistor 35. The other end of the resistor 35 is connected to ground. The electron-absorption body 32 has a Faraday-cage configuration. Almost all the electrons that penetrate the evaluation substrate 30 and impinge on the electron-absorption body 32 are absorbed by the electron-absorption body 32. The number of electrons returning to the evaluation substrate 30, compared to the number of electrons passing through the evaluation substrate to the electron-absorption body 32 is thus very small.

The electron-absorption body 32 is preferably made of an electrically non-insulating material (i.e., conductor or semiconductor) having a mean atomic number of 13 or less. Accordingly, a particularly suitable material is graphite (carbon). The low mean atomic number is especially effective in reducing the number of reflected electrons.

The FIG. 1 embodiment also includes a reflected-electron detector 29 situated close to the bottom surface of the objective lens 15. The reflected-electron detector 29 is operable to detect electrons reflected from the wafer 5. A reflected-electron signal RE from the reflected-electron detector 29 is conducted to the central processor 19.

Operation of the embodiment described above is described with reference to FIG. 4 which provides a perspective of the positional relationship between the mask 1 and the wafer 5. The mask 1 comprises multiple mask subfields 2A, 2B, 2C, . . . arrayed at a fixed pitch in the X-direction and the Y-direction. The mask subfields are separated from one another by boundary regions 3 and struts (not shown) extending below the boundary regions. The electron beam EB is irradiated onto an irradiation region 33 within a subfield (e.g., the subfield 2A in FIG. 4) and propagates to a corresponding transfer subfield (e.g., the transfer subfield 7A) on the wafer 5. The mask 1 can be a so-called scattering mask comprising an electron-transmissive mask membrane (e.g., a silicon nitride thin film) and a thin film on which pattern features are defined by corresponding locations comprising an electron-scattering material (e.g., tungsten). Alternatively, the mask 1 can be a so-called stencil mask (perforated stencil mask) comprising localized voids through which electrons can pass and other localized regions of an electron-scattering material (e.g., silicon) defining the pattern features.

As mentioned above, the electron beam EB that passes through the subfield 2A on the mask 1 is converged by the CPB projection system on a corresponding transfer subfield 7A on the wafer 5 on which a reduced image of the pattern within this subfield 2A is formed. During transfer of an entire mask pattern, each of the subfields 2A, 2B, 2C, . . . 2n is sequentially irradiated by the electron beam EB to produce a corresponding series of exposed transfer subfields 7A, 7B, 7C on the wafer 5. The transfer subfields 7A, 7B, 7C, . . . have no boundary regions or gaps therebetween. In other words, the boundary regions 3 between the mask subfields 2A, 2B, 2C, . . . are "eliminated" during transfer by appropriate horizontal deflections of the electron beam imparted by the deflectors 13A, 13B, that deflect the electron beam EB a distance equal to the width of each strut 3.

Errors of alignment and registration of the transfer subfields are reduced by correcting the image-forming forming characteristics of the projection system. This is accomplished through control of the magnetic excitation electrical current of the CPB projection system and control of the deflectors 13A, 13B.

Figure 4:
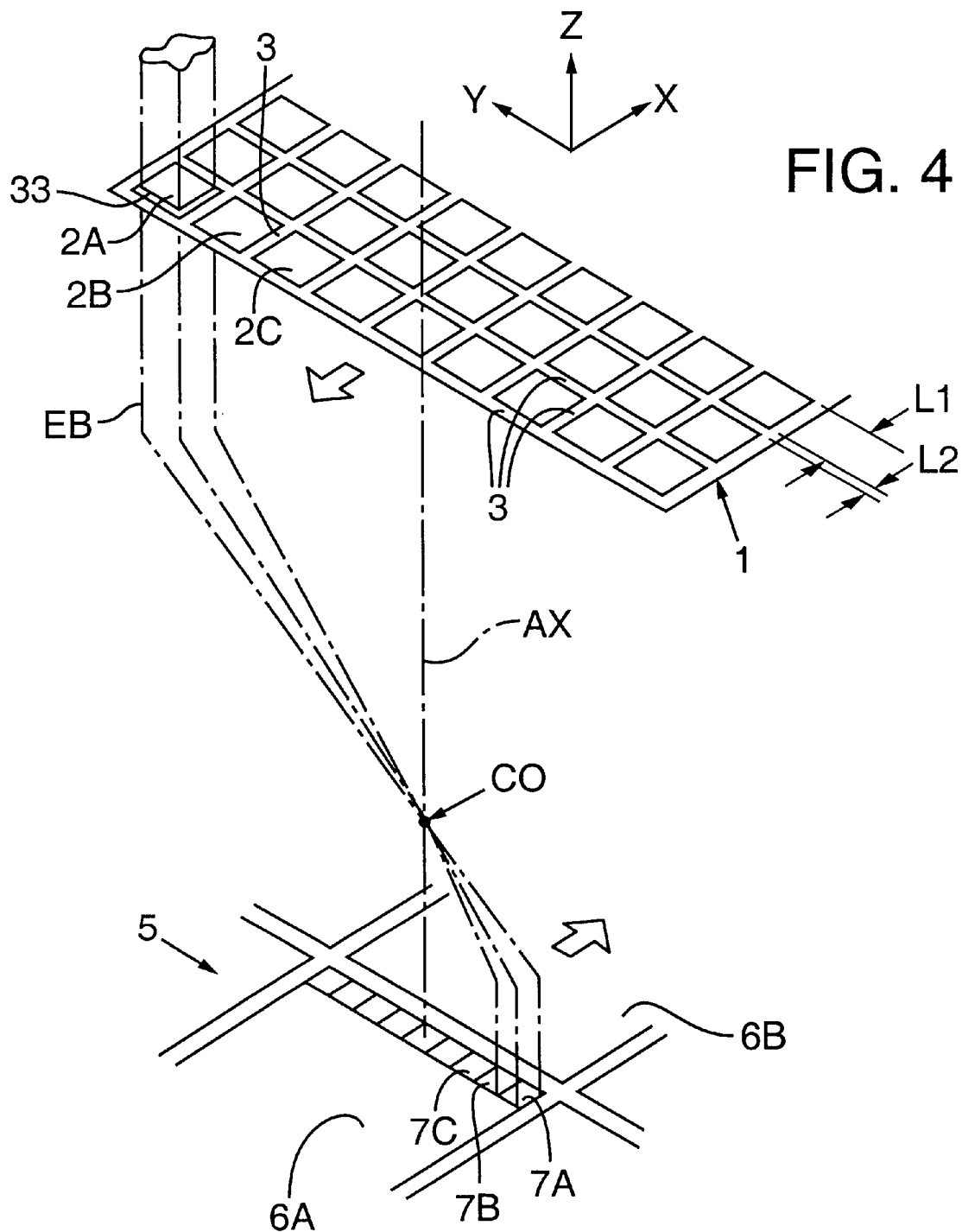
FIG. 4 is a perspective view showing mask subfields in the mask and corresponding transfer subfields on the substrate, as well as general aspects of how each mask subfield is projected onto the respective transfer subfield.

During transfer of the mask pattern to the wafer 5, as shown in FIG. 4, the mask and wafer are synchronously moved relative to the CPB projection system by the mask stage 16 and the wafer stage 21, respectively. The wafer 5 is continuously moved at a constant velocity $V_W$ in the +X direction and the mask 1 is continuously moved at a constant velocity $V_M$ in the −X direction as controlled by the central processor 19. As discussed above, the reduction magnification from the mask to the wafer, as effected by the projection system CPB, is denoted β. If the width (in the X direction) of the pattern-formation region within each mask subfield is denoted L1 and the width (in the X direction) of the boundary region between each mask subfield is denoted L2, then the velocity $V_W$ of the wafer 5 is represented by the following equation:

$$V_W = \beta[L1/(L1+L2)]V_M \qquad (4)$$

The electron beam EB successively irradiates each of the mask subfields 2A, 2B, 2C, . . . in a row of subfields extending in the Y direction by controlled deflection imparted to the beam by the subfield-selection deflectors 12A, 12B. The mask subfields are transferred to the wafer without any intervening gaps or boundary regions. The resulting series of transfer subfields 7A, 7B, 7C, . . . fill up a corresponding row in a transfer field 6A on the wafer 5. The mask and wafer are shifted in opposite X directions to allow transfer of the next row of mask subfields to the corresponding next row of transfer subfields. During transfer of each mask subfield, as indicated in FIG. 4, the electron beam traverses the axis AX at a crossover CO. The transfer field 6A on the wafer represents one "die". After transfer of a die is complete, the wafer stage shifts the wafer appropriately to allow the next transfer field 6B to be exposed.

A preferred embodiment of a method, according to the invention, for evaluating the image-forming characteristics of the CPB projection system are described with reference to FIGS. 5(a)–5(f) and FIGS. 6(a)–6(b). The mask used in the method is preferably a mask especially configured for evaluating the image-forming characteristics, on which mask evaluation patterns are formed in multiple mask subfields.

An enlarged view of a portion of such a mask is shown in FIG. 5(a), in which a series of evaluation patterns 38A–38G is linearly disposed in the X direction on the mask 1. If β=¼ and if the area of the pattern-formation region within each mask subfield is about $(1 \text{ mm})^2$, then the area of an image of a mask subfield produced by the CPB projection system is about $(250 \ \mu m)^2$. (The area of a subfield typically represents the subfield area exposed by the CPB projection system.) The subfield area exposed by the CPB projection system is sufficiently sized to accommodate any of the marker regions 36A–36F on the evaluation substrate 30.

The first evaluation pattern 38A is especially adapted for evaluating the electron intensity distribution within the subfield area exposed by the CPB projection system. The first evaluation pattern 38A comprises small rectangular features 39 arranged peripherally and in two lines that cross in the center of the first evaluation pattern. The image 39W (see FIG. 5(b)) of a rectangular feature 39 projected through the CPB projection system measures approximately 0.2 $\mu$m on each side, which yields the same area as the marker 37A (FIG. 3).

The second and third evaluation patterns 38B, 38C, respectively, on the mask 1 are especially adapted for evaluating resolution and astigmatism of the CPB projection system. Each of the second and third evaluation patterns comprises multiple features 40X, 40Y, respectively, linearly arranged in three rows and three columns. Thus, the features 40X, 40Y are arrayed around the periphery and in the center of the patterns 38B, 38C, respectively. A typical feature 40X produces an image 40XW (FIG. 5(c)), and a typical feature 40Y produces an image 40YW (FIG. 5(d)) by projection through the CPB projection system. The images 40XW and 40YW are configured identically to the markers 37B and 37C, respectively (FIG. 3).

The fourth and fifth evaluation patterns 38D, 38E, respectively, on the mask 1 are especially adapted for evaluating distortion. Each of the fourth and fifth evaluation patterns comprises multiple features 41X, 41Y, respectively, linearly arranged in multiple rows and columns, including multiple linear arrays around the periphery but not in the center of the evaluation patterns 38D, 38E, respectively. Thus, in each of the evaluation patterns 38D, 38E, the center portion is sparse of features and the peripheral regions have many features 41X, 41Y, respectively. The images 41XW and 41YW (FIGS. 5(e) and 5(f)) projected by each feature 41X and 41Y, respectively, through the CPB projection system have the same profiles as the respective markers 37E and 37F (FIG. 3).

The sixth evaluation pattern 38F on the mask 1 is especially adapted for evaluating magnification errors in the X-direction, and comprises two features 41X arranged on the Y-axis with a large distance between the features. Similarly, the seventh evaluation pattern 38G on the mask 1 is especially adapted for evaluating magnification errors in the Y-direction, and comprises two features 41Y arranged on the X-axis with a large distance between the features.

When evaluating the intensity distribution within the subfield area exposed by the CPB projection system, the electron beam is deflected by the subfield-selection deflectors 12A–12B so as to irradiate the evaluation pattern 38A (FIG. 5(a)). The wafer stage 21 is moved so that an image of the evaluation pattern 38A is projected by the CPB projection system on the marker 37A. Thereafter, the central processor 19 drives the wafer stage 21 in the X- and Y-directions to scan the image of the evaluation pattern 38A over the marker 37A. During such scanning, reflected-electron signals RE corresponding to the position of the marker 37 are produced by the reflected-electron detector 29.

When comparatively scanning the image of the evaluation pattern 38A over the marker 37A in the way described above, after the marker 37A is positioned by the wafer stage 21, the image of the evaluation pattern 38A is moved across the marker 37A by the deflectors 13A, 13B. The intensity distribution within the subfield area exposed by the CPB projection system is measured from the intensity distribution of the reflected-electron signal RE obtained from the image of each feature 39 within the evaluation pattern 38A.

When evaluating beam resolution and astigmatism aberrations in the X-direction, the electron beam irradiates the evaluation pattern 38B (FIG. 5(b)) on the mask 1. The marker 37B located within the marker region 36B is moved by the wafer stage 21 to a region where the projected image of the evaluation pattern 38B is located. The central processor 19 drives the wafer stage 21 and the deflectors 13A, 13B in the X-direction to comparatively scan the image of each feature 40X of the evaluation pattern 38B over the marker 37B. The resulting reflected-electron signals RE produced by the reflected-electron detector 29 corresponds to the relative position of the marker 37B.

Figure 6A:
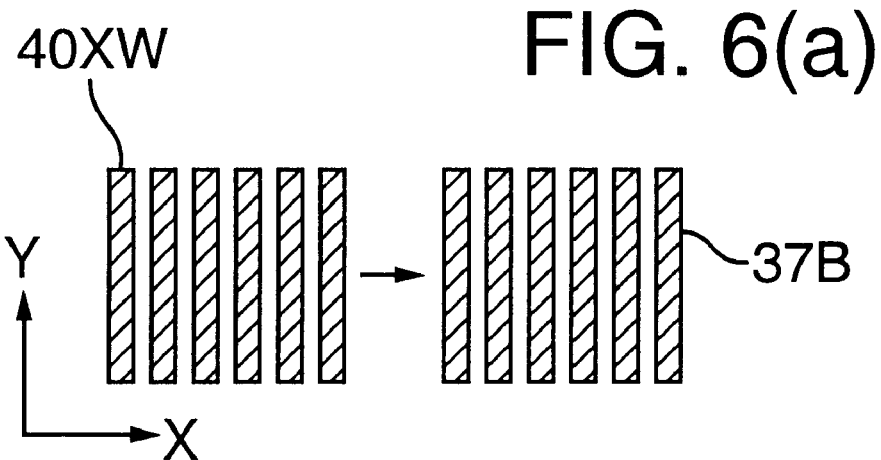
FIG. 6(a) shows a general concept by which a comparative scan is made of a projected image of an evaluation pattern and a respective marker.
Figure 6B:
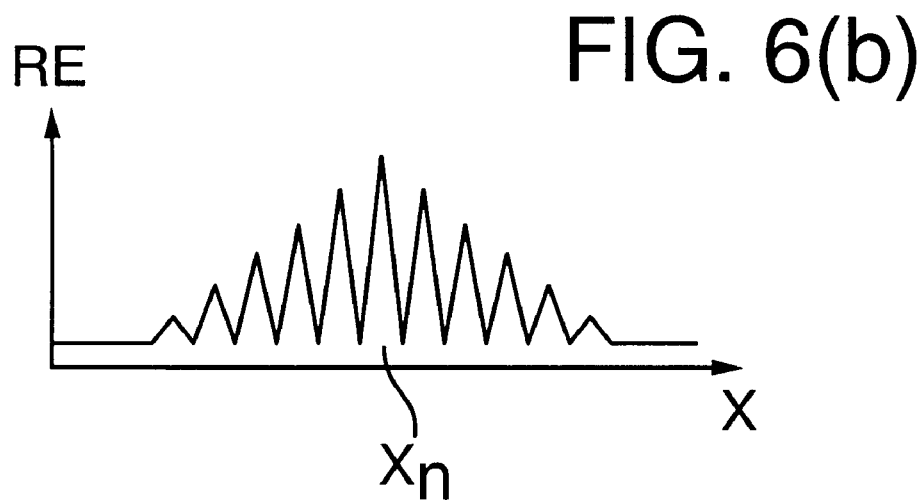
FIG. 6(b) shows a representative waveform of a reflected-electron signal obtained by a comparative scan as shown in FIG. 6(a).

By way of example, FIG. 6(a) shows a situation in which a comparative scan is made of the image 40XW of the feature 40X on the marker 37B. FIG. 6(b) shows an example of the reflected-electron signal RE corresponding to the X-coordinates of the marker 37B (coordinates obtained when scanning the marker 37B side) produced during such a scan. The reflected-electron signal shown in FIG. 6(b) is an ideal signal produced when the resolution of the CPB projection system is very high. In practice, however, due to limitations on such resolution, the reflected-electron signal can have flat bottom and top portions.

Differentiating the reflected-electron signal once with respect to time produces a beam-intensity distribution. Beam resolution in the X-direction can be obtained from the slope angle of the leading edge of the differential signal.

Beam resolution in the Y-direction similarly can be obtained by comparatively scanning the image of the evaluation pattern 38C (FIG. 5(c)) on the marker 37C. The overall beam resolution can be determined as a mean of the beam resolution in the X-direction and the beam resolution in the Y-direction.

Astigmatism measurements within the subfield area exposed by the CPB projection system can be obtained by measuring beam resolution in the X-direction and in the Y-direction at each feature location of the 3×3 configuration of features of the evaluation patterns 38B, 38C while driving the specimen table 20 to change the height (i.e., position in the Z-direction) of the evaluation substrate 30. At each feature location, a determination is made of the amount of height shift required to maximize beam resolution in both the X-direction and the Y-direction.

To evaluate distortion of the CPB projection system in the X-direction, the marker region 36E is illuminated by the evaluation pattern 38D such that an image 40XW of any of the features 41X in the evaluation pattern 38D illuminates the marker 37E. The central processor 19 performs a comparative scan in the X-direction of the image of each feature 41X relative to the marker 37E in the X-direction. During scanning of each feature 41X, a reflected-electron signal RE is obtained by the reflected-electron detector 29. For example, with respect to the image of each feature 41X, the position where the reflected-electron signal RE is at a maximum value is determined. The required corresponding amount of shift in the X-direction, relative to the specified position of the image of each feature 41X, provides a measure of the distortion in the X-direction.

In a manner similar to that described above, distortion in the Y-direction is obtained by comparatively scanning, in the Y-direction, each of the features 41Y in the evaluation pattern 38E (FIG. 5(a)) relative to the marker 37F. A two-dimensional distortion profile is obtained by evaluating the results of such distortion measurements in the X-direction and in the Y-direction.

To evaluate magnification errors of the CPB projection system in the X-direction, the marker 37E on the evaluation substrate 30 is aligned with a projected image of the region 38F of the mask 1 comprising the features 41X. The amount of shift, in the X-direction, from the designed respective positions of the images of the two features 41X is obtained by comparatively scanning, in the X-direction, the image of each feature 41X and the marker 37E. Magnification error in the X-direction is obtained from a corresponding amount of shift, from a value of 1, of a ratio of the interval of actual images of the two features 41X and the designed interval. Similarly, magnification errors in the Y-direction are obtained by comparatively scanning an image of the evaluation pattern 38G for the Y-axis and the marker 37F.

When evaluating image-forming characteristics in such a way, because a material having a thickness of approximately 2 μm with a relatively small number of reflected electrons is used for the marker regions 36A–36F in this embodiment, the number of electrons reflected from regions other than the markers 37A–37E is very small, thus improving the S/N ratio of the reflected-electron signal RE. This allows the image-forming characteristics of the CPB projection system to be evaluated with high accuracy.

Furthermore, in this embodiment, the electron-absorption body 32 is located beneath the evaluation substrate 30. Almost none of the electrons that penetrate the evaluation substrate 30 return to the evaluation substrate 30, thereby further improving the S/N ratio of the reflected-electron signal RE.

Although electrons reflected from the markers 37A–37E are detected, secondary electrons from these markers can be detected as well.

It will be understood that the charged-particle beam need not be an electron beam. Alternatively, the charged-particle beam can be an ion beam. Also, the present invention is not limited to evaluating the image-forming characteristics of a projection system of a transfer apparatus utilizing a divided transfer system. The invention also has utility, for example, for evaluating the image-forming characteristics of a projection system of a transfer apparatus employing a cell-projection, character-projection, or block-exposure system.

In any event, according to the present invention, a very small number of charged particles are reflected from the thin film around the markers and a relatively large number of charged particles are reflected from the markers. Thus, the S/N ratio of a signal produced by detecting the reflected charged particles or secondary electrons from the thin film is very high. This allows the image-forming characteristics of the projection system to be evaluated with high accuracy.

By providing a charged-particle absorption body beneath the thin film, unwanted reflected charged particles or secondary electrons are reduced. Almost none of the charged particles that penetrate the thin film return to the thin-film side. This also improves the S/N ratio of the detection signal and the corresponding accuracy by which the measurements of the image-forming characteristics can be made.

Hence, an intensity profile can be obtained within the subfield area exposed by the CPB projection system. An evaluation pattern is used that comprises an isolated feature having a surface area of $(0.2 \, \mu m)^2$ or larger as a marker on the thin film; also, a plurality of features is used within an area essentially equal to the area of a projected image of the surface area of the feature. The intensity profile is obtained from the reflected charged particles or secondary electrons obtained by comparatively scanning the marker; the projected image of the evaluation pattern is evaluated with high accuracy. Periodic patterns are used comprising lines each having a width that is 4× to 8× the beam resolution and a length that is 10 μm or more. The lines are arranged in groups of 5 to 100 lines at a pitch of 8× to 16× the beam resolution as a marker on the thin film. Thus, the resolution or astigmatism of the projection system can be evaluated with high accuracy from the reflected charged particles or secondary electrons obtained by comparatively scanning the marker and the projected image of the evaluation pattern in the pitch direction.

The periodic line patterns of markers and features preferably comprise lines having a width of 1× to 2× the beam resolution. The lines preferably have a length of 5 μm or less and are preferably arranged in groups of 5 to 25 lines at a pitch of 2× to 4× the beam resolution, When such patterns are used as markers on the thin film and when such patterns are arranged in pluralities at specified positional relationships that are single patterns whose projected images are essentially identical to the periodic pattern as the evaluation pattern, the distortion or magnification errors of the projection system can be evaluated with high accuracy from the reflected charged particles or secondary electrons obtained by comparatively scanning the marker. Thus, each single pattern within the evaluation pattern can be evaluated with high accuracy in the pitch direction.

When using carbon, $SiO_2$, $Si_3N_4$, SiC, or silicon as the material of the thin film, the processing of the material is simplified in addition to reducing the amount of reflected charged particles.

Further, when the charged-particle-absorption body is a conductor or a semiconductor having a surface tapered into a concave surface opposite the thin film, the amount of reflected charged particles is especially reduced.

Whereas the invention has been described in connection with a preferred embodiment, it will be understood that the invention is not limited to that embodiment. On the contrary, the invention is intended to encompass all alternatives, modifications, and equivalents as may be included within the spirit and scope of the invention as defined by the appended claims.

What is claimed is:

1. A method for evaluating an image-forming characteristic of a charged-particle-beam (CPB) projection system that projects onto a second surface an image of a pattern defined on a first surface, the method comprising the steps:

(a) providing on the first surface an evaluation pattern defining at least one feature;

(b) providing on the second surface a film having a thickness of 2 μm or less and comprising a material with a mean atomic number of no greater than 16, the film comprising a marker having a shape corresponding to the feature on the evaluation pattern, the marker comprising a material having a thickness of at least 0.01 μm and a mean atomic number of at least 47;

(c) irradiating the evaluation pattern with a CPB so as to form an image of the feature of the evaluation pattern on the respective marker by directing the CPB to pass through the pattern, through the CPB projection system, and onto the respective marker; and (d) comparatively scanning an image of the evaluation pattern formed by the CPB projection system on the marker, and measuring the intensity of charged particles or secondary electrons generated from the marker during the scanning to produce differential intensity data; and (e) obtaining from the differential intensity data a measurement of the image-forming characteristic.

2. The method of claim 1, wherein:

in step (a), the evaluation pattern comprises multiple subfields each comprising multiple features in an array in each subfield; and in step (b), the film comprises multiple marker regions at least some of which comprising a respective marker, each marker corresponding to a respective feature in at least one subfield.

3. The method of claim 2, wherein each marker has a surface area of at least $(0.2 \, \mu m)^2$.

4. The method of claim 2, wherein each feature on a subfield of the evaluation pattern, when the feature is projected onto the film by the CPB projection system, has an area essentially equal to an area of the respective marker on the film.

5. The method of claim 4, wherein:
at least one subfield comprises a single isolated square feature; and
the marker region corresponding to the subfield having the single isolated square feature comprises an array of square markers, such that comparative scanning of the single isolated square feature relative to each marker provides data concerning an intensity distribution of the charged particle beam across a subfield area exposed by the CPB projection system.

6. The method of claim 4, wherein:
at least one subfield comprises a feature configured as a parallel periodic array of elements; and
the marker region corresponding to the subfield having the parallel periodic of elements comprises an array of markers each comprising a parallel periodic array of elements each having a size, shape, and spacing corresponding to the size, shape, and spacing of the elements of the respective feature when projected on the marker region by the CPB projection system, such that comparative scanning of the feature relative to each marker provides data concerning an imaging characteristic selected from a group consisting of resolution, astigmatism, distortion, and magnification errors of the charged particle beam across a subfield area exposed by the CPB projection system.

7. The method of claim 6, wherein the periodic features are lines.

8. The method of claim 7, wherein:
each of the lines has a width from 4× to 8× the resolution of the CPB, and a length of 10 $\mu$m or more, the lines being arranged in groups of five to 100 lines per feature at a pitch of 8× to 16× the resolution of the CPB, to obtain data concerning resolution or astigmatism of the CPB projection system; and
scanning is performed in a pitch direction of the lines.

9. The method of claim 7, wherein:
each of the lines has a width from 1× to 2× the resolution of the CPB, and a length of 5 $\mu$m or less, the lines being arranged in groups of five to twenty-five lines per feature at a pitch of 2× to 4× the resolution of the CPB, to obtain data concerning distortion or magnification errors of the CPB projection system; and
scanning is performed in a pitch direction of the lines.

10. The method of claim 1, wherein the film is supported over a charged-particle-absorption body.

11. The method of claim 10, further comprising the step of measuring an electrical current produced by the charged-particle-absorption body.

12. The method of claim 10, wherein the charged-particle-absorption body comprises a cylindrical portion and a terminal conical portion.

13. The method of claim 10, wherein the charged-particle-absorption body is made of an electrical conductor or semiconductor.

14. The method of claim 1, wherein the film is provided on an evaluation substrate made of a material selected from the group consisting of carbon, silicon oxide, silicon nitride, silicon carbide, and silicon.

15. A method for evaluating an image-forming characteristic of a charged-particle-beam (CPB) projection system of a CPB microlithography apparatus, the projection system comprising an illumination system for directing a charged particle beam onto a region of a first surface defining a pattern to be projected onto a second surface; a first stage for holding the first surface at a first-surface level as required during illumination of the first surface by the charged particle beam; a CPB projection system for projecting a portion of the charged particle beam passing through the first surface onto a region of the second surface so as to expose the second surface; and a second stage for holding the second surface at a second-surface level during exposure of the second surface; the method comprising:

(a) providing an evaluation pattern on the first stage, the evaluation pattern comprising multiple subfields each comprising multiple features configured in an array in each subfield, the features being projectable as an image by the charged particle beam passing through the evaluation pattern;

(b) providing an evaluation substrate on the second stage, the evaluation substrate comprising multiple marker regions at least some of which comprising a respective marker, each marker corresponding to a respective feature in at least one subfield, the evaluation substrate comprising a material having a mean atomic number of no more than 16, and each marker comprising a material having a thickness of at least 0.01 $\mu$m and a mean atomic number of at least 47, the evaluation pattern and the evaluation substrate being movable relative to each other by actuating the first and second stages, respectively, such that the markers and corresponding features of the evaluation pattern can be comparatively scanned relative to each other;

(c) comparatively scanning the marker and feature relative to each other;

(d) detecting charged particles released from the marker during the comparative scanning, and producing an electrical signal encoding data, obtained during the comparative scanning and detecting, concerning an image-forming characteristic of the CPB projection system; and (e) obtaining from the data a measurement of the image-forming characteristic.

16. The method of claim 15, wherein:
at least one subfield of the evaluation pattern comprises a single square feature; and
the marker region corresponding to the subfield having the single square feature comprises an array of square markers, such that comparative scanning of the square feature relative to each marker provides data concerning an intensity distribution of the charged particle beam across a subfield area exposed by the CPB projection system.

17. The method of claim 15, wherein:
at least one subfield of the evaluation pattern comprises a feature configured as a parallel periodic array of feature elements; and
the marker region corresponding to the subfield having the parallel periodic array of feature elements comprises multiple markers each comprising multiple parallel marker elements each having a size, shape, and spacing corresponding to the size, shape, and spacing of the corresponding feature element of the respective feature when projected on the marker region by the CPB projection system, such that comparative scanning of the feature relative to each marker provides data concerning an imaging characteristic selected from a group consisting of resolution, astigmatism, distortion, and magnification errors of the charged particle beam across a subfield area exposed by the CPB projection system.

18. The method of claim 15, wherein:

the features are lines each having a width from 4× to 8× the resolution of the CPB, and a length of 10 μm or more, the lines being arranged in groups of five to 100 lines per feature at a pitch of 8× to 16× the resolution of the CPB, to obtain data concerning resolution or astigmatism of the CPB projection system; and scanning is performed in a pitch direction of the lines.

19. The method of claim 15, wherein:

the features are lines each having a width from 1× to 2× the resolution of the CPB, and a length of 5 μm or less, the lines being arranged in groups of five to twenty-five lines per feature at a pitch of 2× to 4× the resolution of the CPB, to obtain data concerning distortion or magnification errors of the CPB projection system; and scanning is performed in a pitch direction of the lines.

* * * * *

UNITED STATES PATENT AND TRADEMARK OFFICE
CERTIFICATE OF CORRECTION

PATENT NO. : 5,952,133                      Page 1 of 2
DATED      : September 14, 1999
INVENTOR(S): Mamoru Nakasuji It is certified that error appears in the above-indentified patent and that said Letters Patent is hereby corrected as shown below:

On the Cover Page:

Under the heading [56] References Cited, the following foreign patent documents should be added:

```
-- 4-162512    06/1992    Japan
   6-13300     01/1994    Japan --
```

Column 1, line 31, "erformed" should be --performed--.

Column 2, line 36, the second occurrence of "also" should be deleted.

Column 3, line 59, "reduced keep" should be --reduced to keep--.

Column 5, line 57, "evaluation" should be --evaluating--.

Column 6, line 11, "system.position" should be --system position--.

Column 7, line 46, "lens 1C" should be --lens 11C--.

Column 9, line 22, a paragraph break should be added between "media." and "The".

Column 9, line 67, an end parenthesis --)-- should be added after the period ".".

UNITED STATES PATENT AND TRADEMARK OFFICE
CERTIFICATE OF CORRECTION

PATENT NO.   : 5,952,133                           Page 2 of 2
DATED        : September 14, 1999
INVENTOR(S)  : Mamoru Nakasuji It is certified that error appears in the above-indentified patent and that said Letters Patent is hereby corrected as shown below:

Column 10, line 17, "372" should be --37B--.

Column 15, line 65, the comma "," should be a period --.--.

Signed and Sealed this

Seventeenth Day of April, 2001

*Attest:*

NICHOLAS P. GODICI

*Attesting Officer*       Acting Director of the United States Patent and Trademark Office